United States Patent
Leger et al.

(10) Patent No.: US 7,123,005 B2
(45) Date of Patent: Oct. 17, 2006

(54) MAGNETOMETER WITH STRUCTURE ASYMMETRY CORRECTION

(75) Inventors: Jean-Michel Leger, Villard-Bonnot (FR); Bernard Guilhamat, Saint Michel de Saint Geoirs (FR)

(73) Assignee: Commissariat a l'Energie Atomique, Paris (FR)

( * ) Notice: Subject to any disclaimer, the term of this patent is extended or adjusted under 35 U.S.C. 154(b) by 10 days.

(21) Appl. No.: 10/485,050

(22) PCT Filed: Aug. 13, 2002

(86) PCT No.: PCT/FR02/02870

§ 371 (c)(1),
(2), (4) Date: Jan. 26, 2004

(87) PCT Pub. No.: WO03/016934

PCT Pub. Date: Feb. 27, 2003

(65) Prior Publication Data

US 2004/0196035 A1 Oct. 7, 2004

(30) Foreign Application Priority Data

Aug. 16, 2001 (FR) .................... 01 10851

(51) Int. Cl.
*G01R 33/04* (2006.01)
*G01R 35/00* (2006.01)

(52) U.S. Cl. ...................... 324/253; 324/225

(58) Field of Classification Search ............ 330/84, 330/107, 110; 324/208, 233, 202, 225, 244, 324/247, 253–255, 258, 260
See application file for complete search history.

(56) References Cited

U.S. PATENT DOCUMENTS

| | | | | |
|---|---|---|---|---|
| 3,721,859 A | * | 3/1973 | Blanyer | 361/236 |
| 3,731,752 A | * | 5/1973 | Schad | 175/45 |
| 4,006,407 A | * | 2/1977 | Flaherty et al. | 324/233 |
| 4,007,417 A | * | 2/1977 | Takeuchi et al. | 324/249 |
| 4,277,751 A | * | 7/1981 | Lawson et al. | 324/254 |
| 4,514,689 A | * | 4/1985 | Gerard | 324/207.18 |
| 4,677,381 A | * | 6/1987 | Geerlings | 324/253 |
| 5,134,370 A | * | 7/1992 | Jefferts et al. | 324/247 |
| 5,161,311 A | * | 11/1992 | Esmer et al. | 33/356 |
| 5,838,122 A | * | 11/1998 | Vu | 318/254 |

OTHER PUBLICATIONS

Trifon M. Liakopoulos and Chong H. Ahn, "A Micro-Fluxgate Magnetic Sensor Using Micromachined Planar Solenoid Coils", 1999 Elsevier Science S.A. , 7 pages.

* cited by examiner

*Primary Examiner*—Jay M. Patidar
(74) *Attorney, Agent, or Firm*—Pearne & Gordon LLP

(57) ABSTRACT

A differential magnetometer consisting of at least one active coil (4, 5) and a receiver coil (10) for which the windings are installed differentially, is provided with a measurement circuit (14) with a slaving device that corrects dissymmetry appearing between windings (11, 12) to eliminate residual induction at the frequency of the magnetic excitation field, intended to make the measurement coil (10) more sensitive without applying a voltage to it.

2 Claims, 1 Drawing Sheet

MAGNETOMETER WITH STRUCTURE ASYMMETRY CORRECTION

RELATED APPLCIATIONS

This application claims the benefit of French Application No. 01-10851, filed on Aug. 16, 2001, the entire disclosure of which is hereby incorporated herein by reference.

FIELD OF INVENTION

This invention is related to a magnetometer in which structure dissymmetry are corrected.

BACKGROUND OF THE INVENTION

Fluxgate type magnetometers with differential structure comprise a magnetic core, at least one active coil and a receiver coil that comprises two windings arranged in series around the core such that the magnetic field produced by an excitation current in the active coil creates opposite inductions in the windings of the receiver coil, and induced currents that cancel each other since they are also opposite. They then react to ambient magnetic fields through an induction current with a frequency equal to twice the excitation frequency provided that the active coil excitation current is sufficient. The voltage thus induced at the terminals of the receiver coil is collected and measured by the measurement means.

These magnetometers have a bias (measurement error, visible when the instrument is used in a zero field) that is variable from one instrument to another, which degrades their precision and therefore limits their use in continuous field metrology applications. Furthermore, for a given magnetometer, this bias varies for example as a function of the temperature.

One of the contributions to the bias in the case of a differential structure is related to the residual excitation frequency present at the terminals of receiver coils, because of dissymmetry between the two measurement or excitation branches. When the magnetometer is then operated in field compensation mode (conventional configuration in closed loop that in particular extends its linearity), the effect is to reinject a synchronous component of the excitation frequency with a phase shift from the excitation frequency, into the two branches of the magnetic circuit.

Dissymmetry of the magnetometer consist of irregularities of the diameter of the wire or the turns, or even the number of turns, between the windings in the receiver coil or their relative positions with respect to the excitation coils that have an influence on the mutual inductance between the excitation and induction coils.

BRIEF SUMMARY OF THE INVENTION

Therefore, an attempt was made to restore the equilibrium of the magnetometer by a device integrated into an improved detection circuit that corrects the non-zero induction at the excitation frequency and measurements that are then produced. The invention thus relates to a magnetometer comprising a magnetic core, at least one active coil and a receiver coil, the active coil being arranged so as to create a magnetic excitation field in the core, the receiver coil having two windings, means of passing an alternating current at an excitation frequency in the active coil and means of measuring a voltage induced in the receiver coil, characterised in that the measurement means comprise a detector of a synchronous component at the excitation frequency of the induced voltage, a circuit with two loops each of which comprises one of the windings of the receiver coil, an adder of partial voltages at the terminals of the two loops and a device for correction of one of the said partial voltages, slaved to the said detector.

Apart from the bias reduction that gives a stable measurement at zero field, higher pass bands are obtained for long measurements even when the temperature varies.

The correction device may be a variable resistance.

BRIEF DESCRIPTION OF THE SEVERAL VIEWS OF THE DRAWINGS

The invention will now be described fully in relation to the following figures.

DETAILED DESCRIPTION OF EXAMPLE EMBODIMENTS

Figure 1:
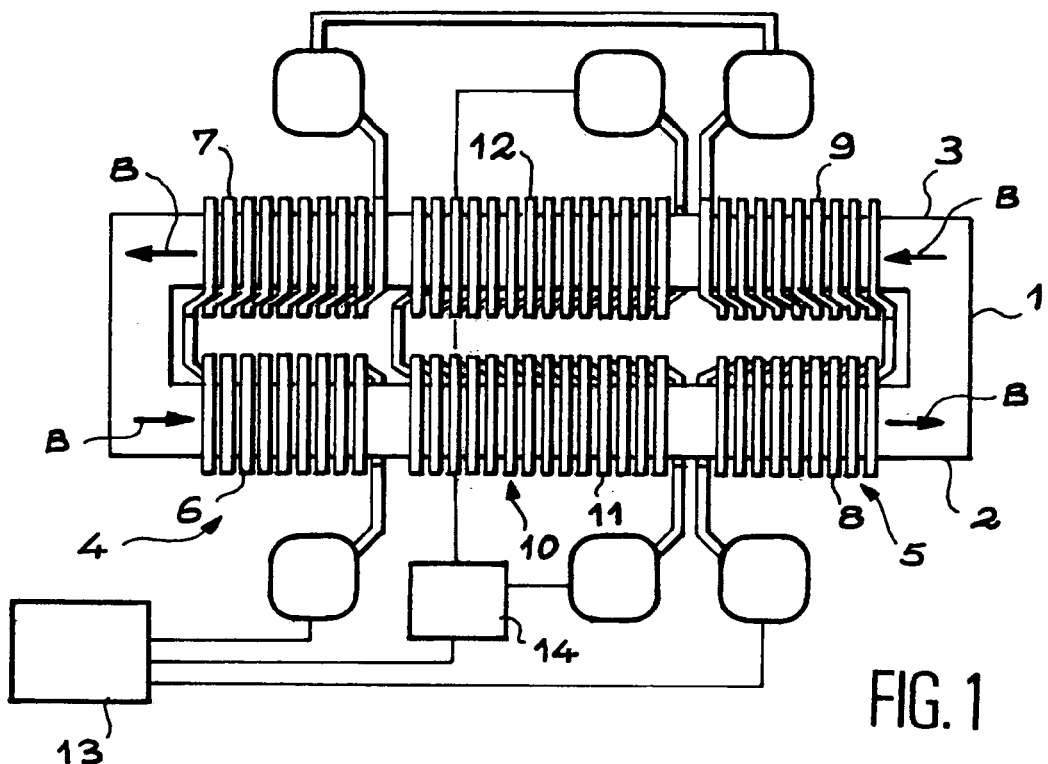
FIG. 1 is a view of a differential magnetometer.

The differential magnetometer in FIG. 1 is of the most frequently used type and includes a magnetic core 1 with at least two main branches 2 and 3. Three coils are wound around the core 1, and more precisely two active coils 4 and 5 each comprising two windings 6, 7 and 8, 9 around branches 2 and 3 respectively, and a receiver coil 10 composed of two windings 11 and 12 also around branches 2 and 3 respectively. The active coils 4 and 5 are connected such that the magnetic excitation field circulates in the reverse direction in the two main branches 2 and 3 in a circuit leading to an excitation device 13, and the receiver coil is at the terminals of a measurement device 14.

The windings 6 and 8 are formed in the same direction around the branch 2, and the windings 7 and 9 in the opposite direction around the other branch 3 so as to create a magnetic field B capable of circulating in the magnetic core when the core is closed as is the case here in which two short branches of the magnetic core 1 connect the main branches 2 and 3. However, the magnetic core 1 could be opened.

The excitation means can supply an excitation current at a determined frequency and may include an oscillator, a frequency divider by two, a square wave to triangular wave converter and a voltage to current converter. The measurement means 14 comprise a pre-amplifier tapping the voltage at the terminals of the receiver coil 10, a synchronous detector supplied by the oscillator signal not divided by two, a lowpass filter, a proportional-integral-differential corrector, an amplifier, a lowpass filter with a cut-off frequency of the order of one Hertz, for example, and display means. A counter reaction current may be applied to the terminals of the measurement coil 10 by tapping the voltage at the output from the correction module and converting it into a current. Obviously, we will not describe these elements that have already been divulged elsewhere and in any case are very simple, and which provide a means of tapping the induced signal at a frequency equal to twice the excitation frequency and converting it into a DC signal before transmitting it to the display means that measure it.

Figure 2:
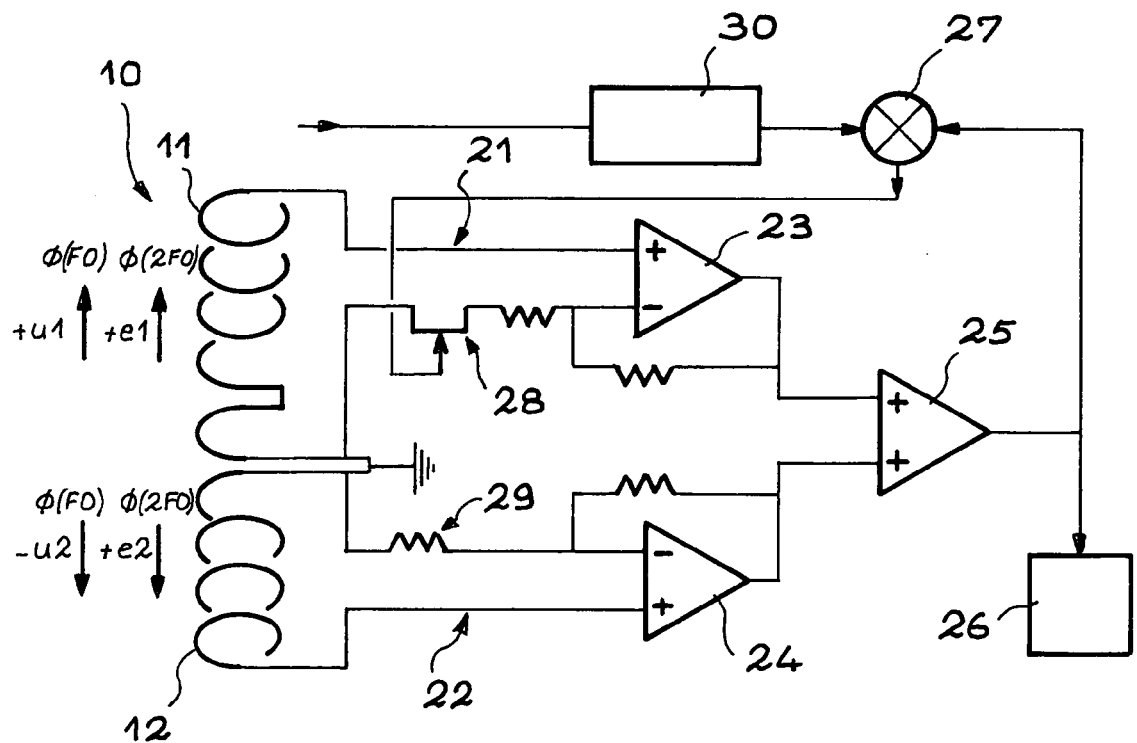
FIG. 2 shows the measurement circuit completed according to the invention.

The magnetic flux produced by the circulation magnetic field $\phi$ ($F_0$) produces voltages induced in each of the windings 11 and 12, u1 and u2 respectively, and the magnetic field to be measured $\phi$ ($2F_0$) produces induced voltages e1 and e2. The voltage u2 is opposite to the other voltages such that the total voltage induced at the terminals of the receiver coil 10 is equal to u1−u2+e1+e2. As we have already seen, the dissymmetry of the windings 11 and 12 is such that e1 and e2 are generally different, and u1 and u2 are also generally different. Therefore, the measurement device 14 is completed in the manner described below and as shown in detail in FIG. 2. Two circuit loops 21 and 22 connect the positive terminals of subtracters 23 and 24 to the ground passing through windings 11 and 12 respectively. The output terminels from subtracters 23 and 24 are connected to the corresponding inputs of an adder 25, and the output from the adder branches to a processing system 26 and to the input of a synchronous detector 27. The negative terminal of the subtracter 24 is connected to the ground through a fixed resistance 29, but the negative terminal of the subtracter 23 is connected to the ground through a variable resistance 28 slaved to the synchronous detector 27. Finally, the excitation device 13 outputs a reference signal at the excitation frequency to another input of the synchronous detector 27 through a phase shifter 30 when necessary.

Assume that the resistances 28 and 29 are equal. The voltages supplied to the output terminals of subtractors 23 and 24 are then equal to a proportional coefficient G multiplied by e1+u1 and e2−u2 respectively, and the voltage at the output from the adder 25 is equal to G (e1+u1+e2−u2). However, the synchronous detector 27 distinguishes the component at the excitation frequency and adjusts the variable resistance 28 to modify the proportional coefficient at the output from the subtractor 23 to a value G' such that G'u1=Gu2. Thus, the voltage output to the processing system 26 becomes equal to G'e1+Ge2 and can be used usefully. No other processing is necessary. This correction effectively restores the symmetry of windings 11 and 12.

The invention claimed is:

1. Magnetometer comprising a magnetic core, at least one active coil (4,5) and a receiver coil (10), the active coil being arranged so as to create a magnetic excitation field in the core, the receiver coil having two windings (11, 12), means for passing an alternating current at an excitation frequency in the active coil and means (14) for measuring a voltage induced in the receiver coil, wherein the measurement means comprise a detector (27) for measuring, in the induced voltage, a synchronous component having the excitation frequency, a circuit with two loops (21, 22) each of which comprises a winding of the receiver coil, an adder (25) for adding values of partial voltages respectively generated at terminals of them loops, thus obtaining the induced voltage and a device for correction (28) of one of the said partial voltages, controlled by the detector.

2. Magnetometer according to claim 1, wherein the correction device (28) is a variable resistance.

* * * * *

UNITED STATES PATENT AND TRADEMARK OFFICE
CERTIFICATE OF CORRECTION

PATENT NO.         : 7,123,005 B2                                           Page 1 of 1
APPLICATION NO.    : 10/485050
DATED              : October 17, 2006
INVENTOR(S)        : Jean-Michel Leger and Bernard Guilhamat It is certified that error appears in the above-identified patent and that said Letters Patent is hereby corrected as shown below:

In the Claims Claim 1:

Column 4, line 21: Delete the word "them", please replace with the word --the--;
Column 4, line 23: Delete the word "said".

Signed and Sealed this

Twenty-sixth Day of June, 2007

JON W. DUDAS
*Director of the United States Patent and Trademark Office*